(12) United States Patent
Rathburn

(10) Patent No.: US 8,829,671 B2
(45) Date of Patent: *Sep. 9, 2014

(54) COMPLIANT CORE PERIPHERAL LEAD SEMICONDUCTOR SOCKET

(71) Applicant: Hsio Technologies, LLC, Maple Grove, MN (US)

(72) Inventor: James Rathburn, Maple Grove, MN (US)

(73) Assignee: Hsio Technologies, LLC, Maple Grove, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/058,863

(22) Filed: Oct. 21, 2013

(65) Prior Publication Data

US 2014/0043782 A1  Feb. 13, 2014

Related U.S. Application Data

(63) Continuation of application No. 13/448,865, filed on Apr. 17, 2012, now Pat. No. 8,610,265, which is a continuation-in-part of application No. 13/266,573, filed as application No. PCT/US2010/036363 on May 27, 2010, said application No. 13/448,865 is a continuation-in-part of application No. 13/318,382, filed as application No. PCT/US2010/036313 on May 27, 2010, said application No. 13/448,865 is a continuation-in-part of application No. PCT/US2010/040197, filed on Jun. 28, 2010, said application No. 13/448,865 is a continuation-in-part of application No. PCT/US2011/062313, filed on Nov. 29, 2011.

(60) Provisional application No. 61/476,504, filed on Apr. 18, 2011, provisional application No. 61/183,411, filed on Jun. 2, 2009, provisional application No. 61/183,335, filed on Jun. 2, 2009, provisional application No. 61/221,380, filed on Jun. 29, 2009, provisional application No. 61/418,625, filed on Dec. 1, 2010.

(51) Int. Cl.
*H01L 23/34* (2006.01)

(52) U.S. Cl.
USPC .............................. 257/727; 257/701; 438/117

(58) Field of Classification Search
USPC ................. 257/700, 701, 726, 727, 758, 759; 438/117, 125, 622
See application file for complete search history.

(56) References Cited

U.S. PATENT DOCUMENTS

| | | | |
|---|---|---|---|
| 3,672,986 | A | 6/1972 | Schneble, Jr. et al. |
| 4,188,438 | A | 2/1980 | Burns |

(Continued)

FOREIGN PATENT DOCUMENTS

| | | |
|---|---|---|
| JP | 2003/217774 | 7/2003 |
| WO | WO 91/14015 | 9/1991 |

(Continued)

OTHER PUBLICATIONS

Notification of Transmittal of the International Search Report and the Written Opinion of the International Searching Authority mailed Jul. 30, 2010 in International Application No. PCT/US2010/036043.

(Continued)

*Primary Examiner* — S. V. Clark
(74) *Attorney, Agent, or Firm* — Stoel Rives LLP

(57) ABSTRACT

An electrical interconnect between terminals on an IC device and contact pads on a printed circuit board (PCB). The electrical interconnect includes a substrate with a first surface having a plurality of openings arranged to correspond to the terminals on the IC device. A compliant material is located in the openings. A plurality of first conductive traces extend along the first surface of the substrate and onto the compliant material. The compliant material provides a biasing force that resists flexure of the first conductive traces into the openings. Vias extending through the substrate are electrically coupled the first conductive traces. A plurality of second conductive traces extend along the second surface of the substrate and are electrically coupled to a vias. The second conductive traces are configured to electrical couple with the contact pads on the PCB.

20 Claims, 13 Drawing Sheets

(56) References Cited

U.S. PATENT DOCUMENTS

| | | | |
|---|---|---|---|
| 4,489,999 A | 12/1984 | Miniet | |
| 4,922,376 A | 5/1990 | Pommer et al. | |
| 4,964,948 A | 10/1990 | Reed | |
| 5,014,159 A | 5/1991 | Butt | |
| 5,161,983 A | 11/1992 | Ohno | |
| 5,237,203 A * | 8/1993 | Massaron | 257/688 |
| 5,286,680 A | 2/1994 | Cain | |
| 5,378,981 A | 1/1995 | Higgins, III | |
| 5,419,038 A | 5/1995 | Wang et al. | |
| 5,454,161 A | 10/1995 | Beilin et al. | |
| 5,479,319 A | 12/1995 | Werther et al. | |
| 5,509,019 A | 4/1996 | Yamamura | |
| 5,527,998 A | 6/1996 | Anderson et al. | |
| 5,659,181 A | 8/1997 | Bridenbaugh | |
| 5,716,663 A | 2/1998 | Capote et al. | |
| 5,741,624 A | 4/1998 | Jeng et al. | |
| 5,761,801 A | 6/1998 | Gebhardt et al. | |
| 5,802,711 A | 9/1998 | Card et al. | |
| 5,819,579 A | 10/1998 | Roberts | |
| 5,904,546 A | 5/1999 | Wood et al. | |
| 5,913,109 A | 6/1999 | Distefano et al. | |
| 5,933,558 A | 8/1999 | Sauvageau et al. | |
| 6,080,932 A | 6/2000 | Smith et al. | |
| 6,118,426 A | 9/2000 | Albert | |
| 6,120,588 A | 9/2000 | Jacobson | |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 | 3/2001 | Haba et al. | |
| 6,207,259 B1 | 3/2001 | Iino et al. | |
| 6,247,938 B1 | 6/2001 | Rathburn | |
| 6,252,564 B1 | 6/2001 | Albert | |
| 6,263,566 B1 * | 7/2001 | Hembree et al. | 29/874 |
| 6,270,363 B1 | 8/2001 | Brofman et al. | |
| 6,312,971 B1 | 11/2001 | Amundson | |
| 6,313,528 B1 | 11/2001 | Solberg | |
| 6,320,256 B1 | 11/2001 | Ho | |
| 6,350,386 B1 | 2/2002 | Lin | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,574,114 B1 | 6/2003 | Brindle et al. | |
| 6,603,080 B2 | 8/2003 | Jensen | |
| 6,614,104 B2 | 9/2003 | Farnworth et al. | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,744,126 B1 | 6/2004 | Chiang | |
| 6,750,473 B2 | 6/2004 | Amundson | |
| 6,758,691 B1 | 7/2004 | McHugh | |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,861,345 B2 | 3/2005 | Ball et al. | |
| 6,910,897 B2 | 6/2005 | Driscoll et al. | |
| 6,967,640 B2 | 11/2005 | Albert | |
| 6,971,902 B2 | 12/2005 | Taylor | |
| 7,045,015 B2 | 5/2006 | Renn | |
| 7,101,210 B2 | 9/2006 | Lin | |
| 7,114,960 B2 | 10/2006 | Rathburn | |
| 7,121,839 B2 | 10/2006 | Rathburn | |
| 7,148,128 B2 | 12/2006 | Jacobson | |
| 7,157,799 B2 | 1/2007 | Noquil et al. | |
| 7,217,996 B2 | 5/2007 | Cheng et al. | |
| 7,220,287 B1 | 5/2007 | Wyrzykowska et al. | |
| 7,229,293 B2 | 6/2007 | Sakurai et al. | |
| 7,244,967 B2 * | 7/2007 | Hundt et al. | 257/99 |
| 7,301,105 B2 | 11/2007 | Vasoya | |
| 7,321,168 B2 | 1/2008 | Tao | |
| 7,326,064 B2 | 2/2008 | Rathburn | |
| 7,327,006 B2 | 2/2008 | Svard et al. | |
| 7,382,363 B2 | 6/2008 | Albert et al. | |
| 7,410,825 B2 | 8/2008 | Majumdar et al. | |
| 7,411,304 B2 | 8/2008 | Kirby et al. | |
| 7,417,299 B2 | 8/2008 | Hu | |
| 7,417,314 B1 | 8/2008 | Lin et al. | |
| 7,423,219 B2 | 9/2008 | Kawaguchi et al. | |
| 7,458,150 B2 | 12/2008 | Totokawa et al. | |
| 7,485,345 B2 | 2/2009 | Renn | |
| 7,508,076 B2 | 3/2009 | Japp et al. | |
| 7,537,461 B2 | 5/2009 | Rathburn | |
| 7,538,415 B1 | 5/2009 | Lin et al. | |
| 7,621,761 B2 * | 11/2009 | Mok et al. | 439/81 |
| 7,632,106 B2 | 12/2009 | Nakamura | |
| 7,651,382 B2 | 1/2010 | Yasumura et al. | |
| 7,658,163 B2 | 2/2010 | Renn | |
| 7,674,671 B2 | 3/2010 | Renn | |
| 7,726,984 B2 | 6/2010 | Bumb et al. | |
| 7,800,916 B2 | 9/2010 | Blackwell et al. | |
| 7,833,832 B2 | 11/2010 | Wood et al. | |
| 7,897,503 B2 | 3/2011 | Foster et al. | |
| 7,898,087 B2 | 3/2011 | Chainer | |
| 8,148,643 B2 | 4/2012 | Hirose et al. | |
| 8,154,119 B2 * | 4/2012 | Yoon et al. | 257/727 |
| 8,158,503 B2 | 4/2012 | Abe | |
| 8,159,824 B2 | 4/2012 | Cho et al. | |
| 8,232,632 B2 | 7/2012 | Rathburn | |
| 8,344,516 B2 | 1/2013 | Chainer | |
| 8,373,428 B2 * | 2/2013 | Eldridge et al. | 324/754.14 |
| 8,525,346 B2 | 9/2013 | Rathburn | |
| 8,610,265 B2 * | 12/2013 | Rathburn | 257/727 |
| 2001/0012707 A1 | 8/2001 | Ho et al. | |
| 2001/0016551 A1 | 8/2001 | Yishio et al. | |
| 2002/0011639 A1 | 1/2002 | Carlson et al. | |
| 2002/0062200 A1 | 5/2002 | Mori et al. | |
| 2002/0079912 A1 | 6/2002 | Shahriari et al. | |
| 2002/0088116 A1 | 7/2002 | Milkovich et al. | |
| 2002/0098740 A1 | 7/2002 | Ooya | |
| 2002/0105080 A1 | 8/2002 | Speakman | |
| 2002/0105087 A1 | 8/2002 | Forbes et al. | |
| 2002/0160103 A1 | 10/2002 | Fukunaga et al. | |
| 2003/0003779 A1 | 1/2003 | Rathburn | |
| 2003/0114029 A1 | 6/2003 | Lee et al. | |
| 2003/0117161 A1 | 6/2003 | Burns | |
| 2003/0156400 A1 | 8/2003 | Dibene et al. | |
| 2003/0162418 A1 | 8/2003 | Yamada | |
| 2003/0188890 A1 | 10/2003 | Bhatt et al. | |
| 2004/0029411 A1 | 2/2004 | Rathburn | |
| 2004/0048523 A1 | 3/2004 | Huang et al. | |
| 2004/0054031 A1 | 3/2004 | Jacobson | |
| 2004/0070042 A1 | 4/2004 | Lee et al. | |
| 2004/0077190 A1 | 4/2004 | Huang et al. | |
| 2004/0174180 A1 | 9/2004 | Fukushima et al. | |
| 2004/0183557 A1 | 9/2004 | Akram | |
| 2004/0184219 A1 | 9/2004 | Otsuka et al. | |
| 2004/0217473 A1 | 11/2004 | Shen | |
| 2004/0243348 A1 | 12/2004 | Minatani | |
| 2005/0048680 A1 | 3/2005 | Matsunami | |
| 2005/0101164 A1 | 5/2005 | Rathburn | |
| 2005/0164527 A1 * | 7/2005 | Radza et al. | 439/66 |
| 2006/0001152 A1 | 1/2006 | Hu | |
| 2006/0012966 A1 | 1/2006 | Chakravorty | |
| 2006/0024924 A1 | 2/2006 | Haji et al. | |
| 2006/0044357 A1 | 3/2006 | Andersen | |
| 2006/0087064 A1 | 4/2006 | Daniel et al. | |
| 2006/0157103 A1 | 7/2006 | Sheats et al. | |
| 2006/0160379 A1 | 7/2006 | Rathburn | |
| 2006/0208230 A1 | 9/2006 | Cho et al. | |
| 2006/0258912 A1 | 11/2006 | Belson et al. | |
| 2006/0261827 A1 | 11/2006 | Cooper et al. | |

(56) References Cited

U.S. PATENT DOCUMENTS

| | | |
|---|---|---|
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0221404 A1 | 9/2007 | Das et al. |
| 2007/0232059 A1 | 10/2007 | Abe |
| 2007/0259539 A1* | 11/2007 | Brown et al. .......... 439/66 |
| 2007/0269999 A1 | 11/2007 | Di Stefano |
| 2007/0273394 A1 | 11/2007 | Tanner et al. |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0057753 A1 | 3/2008 | Rathburn et al. |
| 2008/0073110 A1 | 3/2008 | Shioga et al. |
| 2008/0093115 A1 | 4/2008 | Lee |
| 2008/0143358 A1 | 6/2008 | Breinlinger |
| 2008/0143367 A1 | 6/2008 | Chabineau-Lovgren |
| 2008/0157361 A1 | 7/2008 | Wood et al. |
| 2008/0185180 A1 | 8/2008 | Cheng et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2009/0039496 A1 | 2/2009 | Beer et al. |
| 2009/0058444 A1 | 3/2009 | McIntyre |
| 2009/0061089 A1 | 3/2009 | King |
| 2009/0127698 A1 | 5/2009 | Rathburn |
| 2009/0224404 A1 | 9/2009 | Wood et al. |
| 2009/0241332 A1 | 10/2009 | Lauffer et al. |
| 2010/0133680 A1 | 6/2010 | Kang et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2008/0156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |

OTHER PUBLICATIONS

Notification of Transmittal of the International Search Report and the Written Opinion of the International Searching Authority mailed Jul. 21, 2010 in International Application No. PCT/US2010/036047.

Notification of Transmittal of the International Search Report and the Written Opinion of the International Searching Authority mailed Jul. 28, 2010 in International Application No. PCT/US2010/036363.

Notification of Transmittal of the International Search Report and the Written Opinion of the International Searching Authority mailed Jul. 28, 2010 in International Application No. PCT/US2010/036377.

Notification of Transmittal of the International Search Report and the Written Opinion of the International Searching Authority mailed Jul. 30, 2010 in International Application No. PCT/US2010/036388.

Notification of Transmittal of the International Search Report and the Written Opinion of the International Searching Authority mailed Jul. 27, 2010 in International Application No. PCT/US2010/036397.

Notification of Transmittal of the International Search Report and the Written Opinion of the International Searching Authority mailed Jul. 30, 2010 in International Application No. PCT/US2010/036055.

Notification of Transmittal of the International Search Report and the Written Opinion of the International Searching Authority mailed Aug. 4, 2010 in International Application No. PCT/US2010/036288.

Notification of Transmittal of the International Search Report and the Written Opinion of the International Searching Authority mailed Aug. 4, 2010 in International Application No. PCT/US2010/036285.

Notification of Transmittal of the International Search Report and the Written Opinion of the International Searching Authority mailed Jul. 30, 2010 in International Application No. PCT/US2010/036282.

Notification of Transmittal of the International Search Report and the Written Opinion of the International Searching Authority mailed Jul. 30, 2010 in International Application No. PCT/US2010/036295.

Notification of Transmittal of the International Search Report and the Written Opinion of the International Searching Authority mailed Jul. 30, 2010 in International Application No. PCT/US2010/036313.

Notification of Transmittal of the International Search Report and the Written Opinion of the International Searching Authority mailed Aug. 3, 2010 in International Application No. PCT/US2010/037619.

Notification of Transmittal of the International Search Report and the Written Opinion of the International Searching Authority mailed Sep. 7, 2010 in International Application No. PCT/US2010/038600.

Notification of Transmittal of the International Search Report and the Written Opinion of the International Searching Authority mailed Aug. 18, 2010 in International Application No. PCT/US2010/038606.

(56) References Cited

OTHER PUBLICATIONS

Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.
Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Notification of Transmittal of the International Search Report and the Written Opinion of the International Searching Authority mailed Jun. 3, 2013 in International Application No. PCT/US2013/031395.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 7, 2013 in International Application No. PCT/US2013/030856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrated Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Restriction Requirement mailed Jun. 13, 2013 in co-pending U.S. Appl. No. 13/266,486, now published as US Patent Application Publication No. US 2012/0055701.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Restriction Requirement mailed Oct. 1, 2013 in co-pending U.S. Appl. No. 13/266,573, now published as US Patent Application Publication No. 2012/0061846.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 2013 in co-pending U.S. Appl. No. 13/318,200, now published as US Patent Application Publication No. US 2012/0056332.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Office Action mailed Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 26, 2013 in co-pending U.S. Appl. No. 13/319,120 now published as US Patent Application Publication No. US 2012/0061851.
Restriction Requirement mailed Oct. 1, 2013 in co-pending U.S. Appl. No. 13/319,145, now published as US Patent Application Publication No. 2012/0049342.
Examiner-Initiated Interview Summary mailed Mar. 14, 2013 in co-pending U.S. Appl. No. 13/319,228, now published as US Patent Application Publication No. US 2012/0058653.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed Sep. 16, 2013 in co-pending U.S. Appl. No. 13/413,724, now published as US Patent Application Publication No. US 2012/0168948.

(56) References Cited

OTHER PUBLICATIONS

Notice of Allowance and Fee(s) Due mailed Oct. 2, 2013 in co-pending U.S. Appl. No. 13/448,865, now published as US Patent Application Publication No. US 2012/0199985.

Office Action mailed May 9, 2013 in co-pending U.S. Appl. No. 13/448,914, now published as US Patent Application Publication No. US 2012/0202364.

Amendment and Response filed May 20, 2013 in co-pending U.S. Appl. No. 13/448,914, now published as US Patent Application Publication No. US 2012/0202364.

Notice of Allowance and Fee(s) Due mailed Jul. 28, 2013 in co-pending U.S. Appl. No. 13/448,914, now published as US Patent Application Publication No. US 2012/0202364.

Co-pending U.S. Appl. No. 13/969,953 titled Compliant Conductive Nano-Particle Electrical Interconnect, filed Aug. 19, 2013.

* cited by examiner

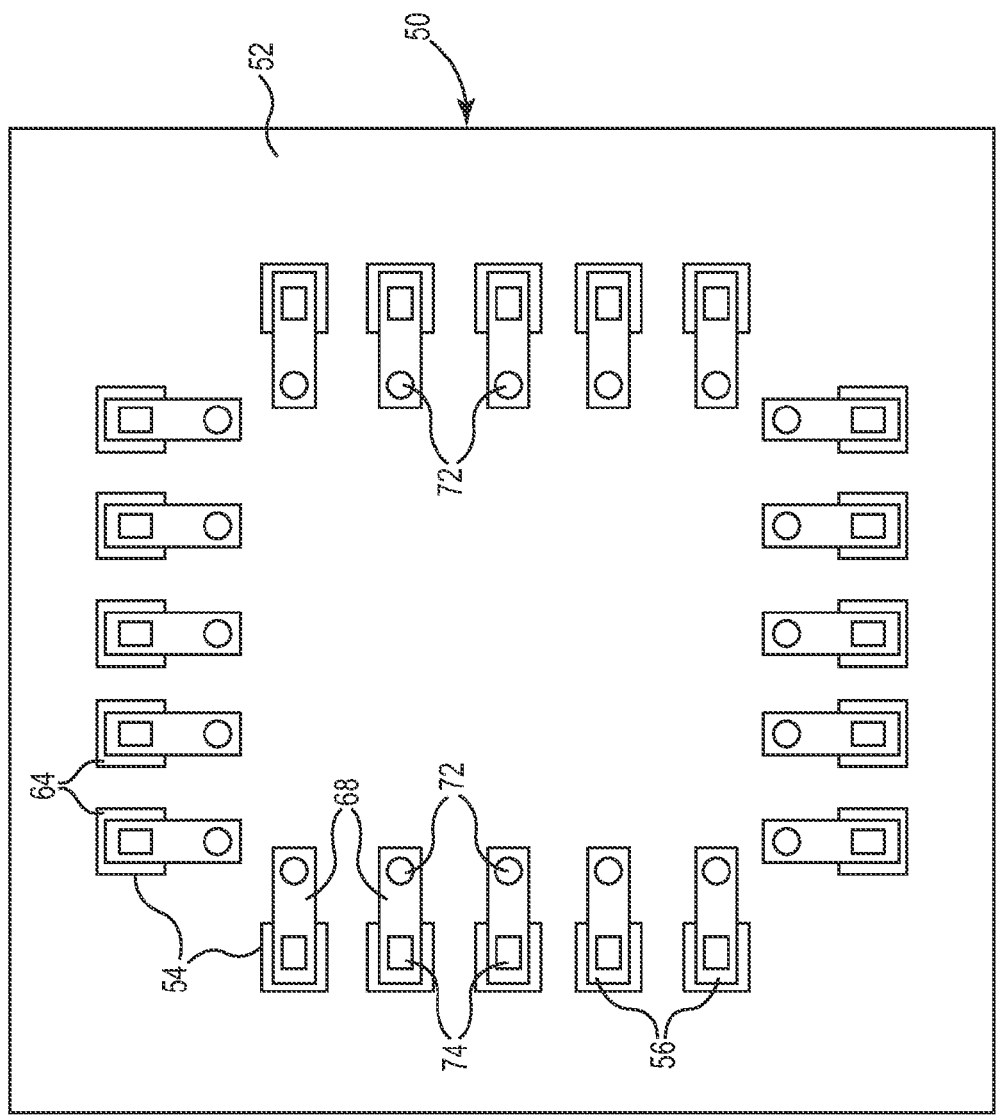

COMPLIANT CORE PERIPHERAL LEAD SEMICONDUCTOR SOCKET

RELATED APPLICATIONS

This application is a continuation of U.S. patent application Ser. No. 13/448,865, entitled COMPLIANT CORE PERIPHERAL LEAD SEMICONDUCTOR TEST SOCKET, filed Apr. 17, 2012 (Allowed), which claims the benefit of U.S. Provisional Application No. 61/476,504, filed Apr. 18, 2011, the disclosures of which are hereby incorporated by reference.

This application is a continuation-in-part of U.S. patent application Ser. No. 13/266,573, titled COMPLIANT PRINTED CIRCUIT AREA ARRAY SEMICONDUCTOR DEVICE PACKAGE, filed Oct. 27, 2011, which is a national stage application under 35 U.S.C. §371 of International Application No. PCT/US2010/036363, titled COMPLIANT PRINTED CIRCUIT AREA ARRAY SEMICONDUCTOR DEVICE PACKAGE, filed May 27, 2010, which claims priority to U.S. Provisional Application No. 61/183,411, filed Jun. 2, 2009, all of which are hereby incorporated by reference in their entireties.

This application is a continuation-in-part of U.S. patent application Ser. No. 13/318,382, entitled RESILIENT CONDUCTIVE ELECTRICAL INTERCONNECT, filed Oct. 1, 2011, which is a national stage application under 35 U.S.C. §371 of International Application No. PCT/US2010/036313, titled RESILIENT CONDUCTIVE ELECTRICAL INTERCONNECT, filed May 27, 2010, which claims priority to U.S. Provisional Application No. 61/183,335, filed Jun. 2, 2009, all of which are hereby incorporated by reference in their entireties.

The present application is a continuation-in-part of International Application No. PCT/US2010/040197, titled SINGULATED SEMICONDUCTOR DEVICE SEPARABLE INTERCONNECT, filed Jun. 28, 2010, which claims the benefit of U.S. Provisional Application No. 61/221,380, filed Jun. 29, 2009, which are hereby incorporated by reference in their entireties.

The present application is a continuation-in-part of International Application No. PCT/US2011/062313, titled HIGH PERFORMANCE SURFACE MOUNT ELECTRICAL INTERCONNECT, filed Nov. 29, 2011, which claims the benefit of U.S. Provisional Application No. 61/418,625, filed Dec. 1, 2010, which are hereby incorporated by reference in their entireties.

TECHNICAL FIELD

The present disclosure relates to a high performance electrical interconnect between an integrated circuit and a printed circuit assembly. The present electrical interconnect is particularly useful as a semiconductor socket.

BACKGROUND OF THE INVENTION

Traditional peripheral lead integrated circuit (IC) test sockets are generally constructed of a machined engineering grade plastic housing and frame, which is populated with a series of contact members that correspond to the terminals on two or four sides of the IC device. These contacts provide a connection between the IC device terminals and the appropriate location on a test printed circuit board (PCB), also called a test or load board. This electrical connection provides the mechanism to power the IC device and test performance.

The IC devices are graded based upon performance, and the devices that pass are identified while the devices that fail are either retested or discarded. In many cases, the performance windows in which the IC devices must operate can be fairly precise. Accordingly, the electrical performance of the contact members in the socket is important so as to not introduce degradation in signal or power delivery. A socket with good electrical performance is critical for many IC testing functions since poor performance can result in retesting or discarding devices that are actually acceptable but failed the test due to degradation within the socket.

IC manufacturers and their sub-contractors test millions or even billions of devices, and it is important for the socket to not only perform well electrically, but to also be mechanically robust enough to last hundreds of thousands of test cycles before being replaced. Many of the traditional sockets utilize very small metal contacts that are biased using an elastomer. These contact members are mechanically compressed as the device is pushed against the contacts. An elastomeric material functions like a spring and provides the normal force to return the contact to the original position. The elastomeric material functioning as a spring member allows the contact members to be much shorter than they otherwise would have to be in order to fashion a spring in conjunction with a contact member. The short length provides an electrical path that has fewer distortion effects as the current or signal passes through the contact. In some cases, spring probes are used which contain opposing metal contacts that are biased by a coil spring.

There is a wide range of contact types used in traditional sockets. In general, they all have a range of mechanical life that is limited by the effects of contacting the solder that is plated onto the terminals of the IC device. As the solder collects on the tips of the contacts, the Tin within the solder oxidizes to form a high resistance layer that causes the contact to lose electrical performance.

In some cases, the contacts move with respect to the interface to the circuit board as the device actuates the contact. This movement can cause wear on the PCB which can degrade performance of the circuit board. In general, the need for thousands of cycles before replacement drives sophisticated design that can be expensive. The socket volumes can also be relatively small requiring custom production methods that can also be expensive. The methods used to produce the plastic socket housings which hold the contacts are typically expensive precision machining operations. Many of the sockets are assembled by hand, where the elastomeric members and contacts are inserted by hand under magnification.

Socket users typically look for the best mix of electrical performance, yield, cost, and mechanical life to determine the costs to test each IC device. Electrical performance can be a hurdle that eliminates many of the socket options. Those sockets that can pass the electrical performance requirements can be limited by cost or the amount of use before they must be repaired or replaced. It can take hours or days to replace the failing socket, with the corresponding unit volume of IC devices which could have been tested being a major factor in the overall cost of use (e.g., an opportunity cost). Damage to the PCB used for the test interface can also dramatically impact the cost of use as the PCB's can be very expensive and have a long lead-time to build (and replace).

Traditional IC sockets have reached an electrical performance limit. Next generation IC devices will operate above 5 GHz and beyond and the existing IC sockets do not provide acceptable performance levels without significant revision.

BRIEF SUMMARY OF THE INVENTION

The present disclosure is aimed at an interconnect that is inexpensive to produce, has relative long life and provides excellent electrical performance.

One embodiment is directed to an electrical interconnect between terminals on an IC device and contact pads on a printed circuit board (PCB). The electrical interconnect includes a substrate with a first surface having a plurality of openings arranged to correspond to the terminals on the IC device. A compliant material is located in the openings. A plurality of first conductive traces extends along the first surface of the substrate and onto the compliant material. The compliant material provides a biasing force that resists flexure of the first conductive traces into the openings. Vias extending through the substrate are electrically coupled the first conductive traces. A plurality of second conductive traces extends along the second surface of the substrate and is electrically coupled to a vias. The second conductive traces are configured to electrical couple with the contact pads on the PCB.

In one embodiment, first conductive structures are electrically coupled to the first conductive traces and positioned over the openings. The first conductive structures are configured to enhance electrical coupling with the terminals on the IC device. At least one dielectric layer is optionally selectively located on the first surface of the substrate to cover the conductive traces, while leaving the first conductive structures exposed. The openings preferably extend through the substrate to a second surface.

The second conductive traces preferably extend onto a compliant material to provide a biasing force that resists flexure of the second conductive traces when compressively engaged with the contact pads on the printed circuit board. Second conductive structures are optionally electrically coupled to the second conductive traces that enhance electrical coupling with the contact pads on the PCB.

In one embodiment, at least one of the first or second conductive traces is discrete structures attached to the substrate. The first conductive traces are optionally soldered to the terminals on the IC device.

The substrate optionally includes at least one additional circuitry plane. The additional circuitry plane is selected from one of a ground plane, a power plane, an electrical connection to other circuit members, a dielectric layer, or a flexible circuit. At least one printed electrical device is optionally located on the substrate and electrically coupled to at least a one of the first or second conductive traces. The electrical device is selected from one of shielding, near device decoupling, capacitors, transistors, resistors, filters, signal or power altering and enhancing devices, memory devices, embedded IC devices, RF antennae, and the like.

The present disclosure is also directed to an electrical interconnect assembly including a housing that retains the electrical interconnect. The IC device is located in the housing so the terminals on the IC device are electrically coupled to the first conductive traces. Terminals on the printed circuit board are soldered to the second conductive traces located at the second surface of the substrate.

The present disclosure is also directed to a method of making an electrical interconnect between terminals on an IC device and contact pads on a printed circuit board (PCB). The method includes forming a plurality of openings in a first surface of a substrate at locations corresponding to the terminals on the IC device. A compliant material is located in the openings. A plurality of first conductive traces is located on the first surface that extends onto the compliant material. The compliant material provides a biasing force that resists flexure of the first conductive traces into the openings. Vias extending through the substrate are electrically coupled the first conductive traces. A plurality of second conductive traces extends along the second surface of the substrate electrically coupled to a vias. The second conductive traces are configured to electrical couple with the contact pads on the PCB.

The method includes electrically coupling the terminals on the IC device with the conductive structures on the first surface of the substrate. The IC device can be biased against the first surface of the substrate to flex the conductive traces into the openings against the resistance of the compliant material. The method also includes electrically coupling the contact pads on the PCB with the conductive structures on the second surface of the substrate. The PCB is biased against the second surface of the substrate to flex the conductive traces into the openings against the resistance of the compliant material.

The present disclosure leverages the capabilities of precision additive printed circuit fabrication techniques to create a compliant core structure that is designed to interface to a test board and make an electrical contact to the terminal on an IC device. In basic terms, contact points can be created and positioned in the desired location relative to the points of contact to the PCB and the IC device terminals. A series of etching and plating techniques can be employed to create a very precise and short electrical path. The contact members can be supported and biased by compliant materials that can be printed in an appropriate location to provide the desired effect when compressed. The nature of the compliant printed circuit fabrication process allows for many electrical enhancements not possible with traditional socket fabrication and testing techniques.

The disclosed compliant printed circuit fabrication process can allow for very high frequency performance, as well as the addition of on-board electrical devices and circuitry planes that are not available with other sockets. The production cost for sockets in accordance with the present disclosure can be a fraction the cost of producing existing sockets. Use of additive printing processes, such as for example to print electrical features, can reduce capital cost and lead time for building the present sockets. The additive printing processes can also increase yields over conventional sockets that rely on conventional lithography tools and masks.

Internal compliance of the entire socket and of individual contact members on the compliant printed circuit greatly increases performance of the present sockets. The ability to build multi-layer structures over a relatively large area can permit terminal pitch on the IC devices to be reduced. The addition of circuitry planes and electrical devices in the present sockets can provide performance enhancements not available with current sockets. The ability to add electrical devices, such as transistors and memory, to the present socket can provide the opportunity to incorporate test intelligence, extending the use of legacy test equipment and improving test performance. The present sockets can provide the opportunity to develop adaptive testing and to alter the IC devices during testing.

The use of additive printing processes can permit the material set in a given layer to vary. Traditional PCB and circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect can provide advantages in tuning impedance or adding electrical function on a given layer. Tuning performance on a layer by layer basis relative to the previous layer can greatly enhance electrical performance.

The present disclosure merges the long-term performance advantages of traditional PCB and semiconductor packaging with the flexibility of additive printing technology. By combining methods used in the PCB fabrication and semiconductor packaging industries, the present disclosure enables fine line high density circuit structures with attractive cost of manufacture.

The present high performance electrical interconnect can be treated as a system of its own by incorporating electrical devices or other passive and active function, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the interconnect assembly.

The present high performance electrical interconnect can be produced digitally, without tooling or costly artwork. The high performance electrical interconnect can be produced as a "Green" product, with dramatic reductions in environmental issues related to the production of conventional flexible circuits.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

At least one electrical device is optionally printed on a dielectric layer and electrically coupled to at least a portion of the circuit geometry. Optical quality materials can be printed or deposited in at least a portion of the recesses to form optical circuit geometries. Alternatively, optical fibers can be located in the recesses.

The present disclosure also relates to an electrical interconnect assembly including a housing that retains the present electrical interconnect. An IC device with solder balls is located in the openings in the socket substrate and electrically coupled to the contact tips of the contact tabs. A PCB is soldered to the contact pads located at the second surface of the socket substrate.

The present disclosure is also directed to a method of making an electrical interconnect configured to provide an interface between solder balls on an IC device and a PCB. The method includes forming a socket substrate with a first surface, a second surface, and a plurality of openings sized and configured to receive the solder balls on the IC device. A plurality of electrically conductive contact tabs are secured to the socket substrate so that at least one contact tip of the contact tabs extends into the openings. The contact tips electrically couple the IC device when the solder balls are positioned in the openings. Vias in the socket substrate electrically couple the contact tabs to contact pads located proximate the second surface of the socket substrate. Solder balls attached to the contact pad electrically and mechanically couple the electrical interconnect to the PCB.

BRIEF DESCRIPTION OF THE SEVERAL VIEWS OF THE DRAWING

FIGS. 1A and 1B illustrate an electrical interconnect with conductive traces supported by a compliant material in accordance with an embodiment of the present disclosure.

DETAILED DESCRIPTION OF THE INVENTION

A high performance electrical interconnect according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch high performance electrical interconnects are especially useful for communications, wireless, and memory devices.

The present high performance electrical interconnect can be configured as a low cost, high signal performance interconnect assembly, which has a low profile that is particularly useful for desktop and mobile PC applications. IC devices can be installed and uninstalled without the need to reflow solder. The solder-free electrical connection of the IC devices is environmentally friendly.

Figure 1A:
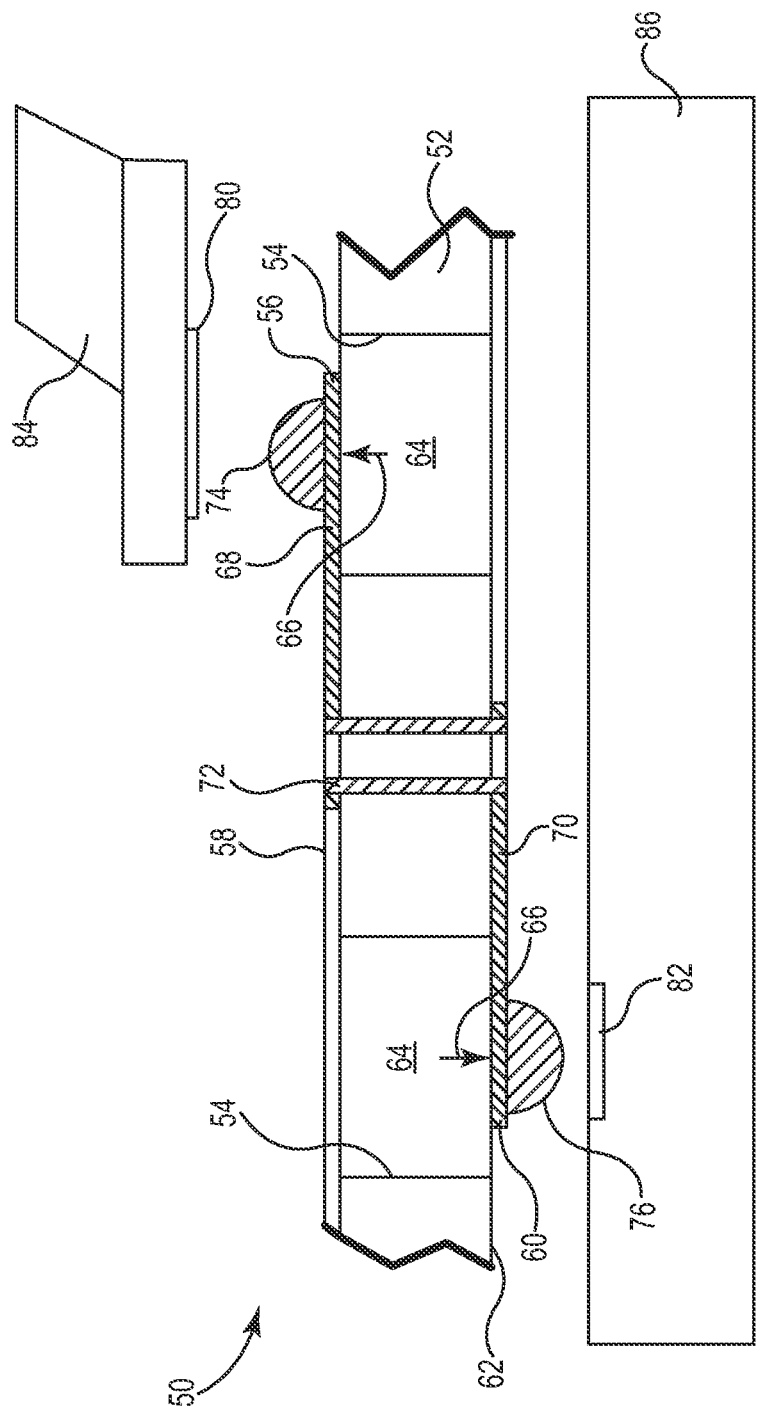

FIG. 1A is a side sectional view of an electrical interconnect 50 in accordance with an embodiment of the present disclosure. Core material 52 is drilled, imaged or molded to create a series of openings or recesses 54 configured to correspond to IC terminals 56 on the top surface 58, and the circuit board PCB terminal 60 on bottom surface 62. The core openings 54 are filled or partially filled with compliant material 64, such as for example silicone or urethane, that when cured provides a normal force 66 and resilient support for the terminals 56, 60.

The present embodiment leverage a technique which treats the substrate 52 as if it were a printed circuit board. A 3D structure is created that takes advantage of the normal "core" area within a traditional printed circuit board, which is normally not utilized as circuit area and primarily serves as a mechanical support member for the fashioned circuitry.

The terminals 56, 60 include conductive members 68, 70 that extend into the openings 54 and onto the compliant material 64. The conductive members 68, 70 are typically an etched sheet of copper or copper alloy shaped to provide the desired electrical path to the terminals 56, 60. In the illustrated embodiment, the conductive members 68 is constructed from ½ oz copper or copper alloy foil (0.7 mil thick). In the illustrated embodiment, the conductive members 68, 70 are electrically coupled by plated via 72.

The terminals 56, 60 are optionally processed to include raised conductive structures 74, 76, such as for example solder balls, to facilitate contact to the terminals 80 to the IC device 84 and terminals 82 to the PCB 86. The raised conductive structures 74, 76 can be constructed by plating, sputtering, etched bulk material, coining, and the like.

FIG. 1B is a top view of the electrical interconnect 50 for use with QFN or Quad Flat No Lead devices in accordance with an embodiment of the present disclosure. An array of conductive members 68 and raised structures 74 are arranged around perimeter 88 of the substrate 52. The raised structures 74 are arranged in a configuration corresponding to the terminals on the IC device 84. The conductive members 68 are electrically coupled to PCB 86 on the bottom surface (see e.g., FIG. 1A) by the vias 72. In the illustrated embodiment, the recesses 54 are rectangular filed with a compliant material 64 located behind each of the IC terminals 56. The present electrical interconnect 50 can also be used with gull wing leaded devices or staggered row arrays.

The IC terminals 56 are preferably plated or sputtered with copper, nickel, or nickel over copper as one of many options to create a raised bump to enhance the electrical contact with the IC device. As noted above, the conductive members 54 deflects when engaged with the IC device, supported by a normal force generate by the compliant material 64.

In one embodiment, the contact members 68 are discrete structures that are bonded to the substrate 52. In another embodiment, the substrate 52 and contact members 68 are processed by plating with solder masks.

Figure 2:
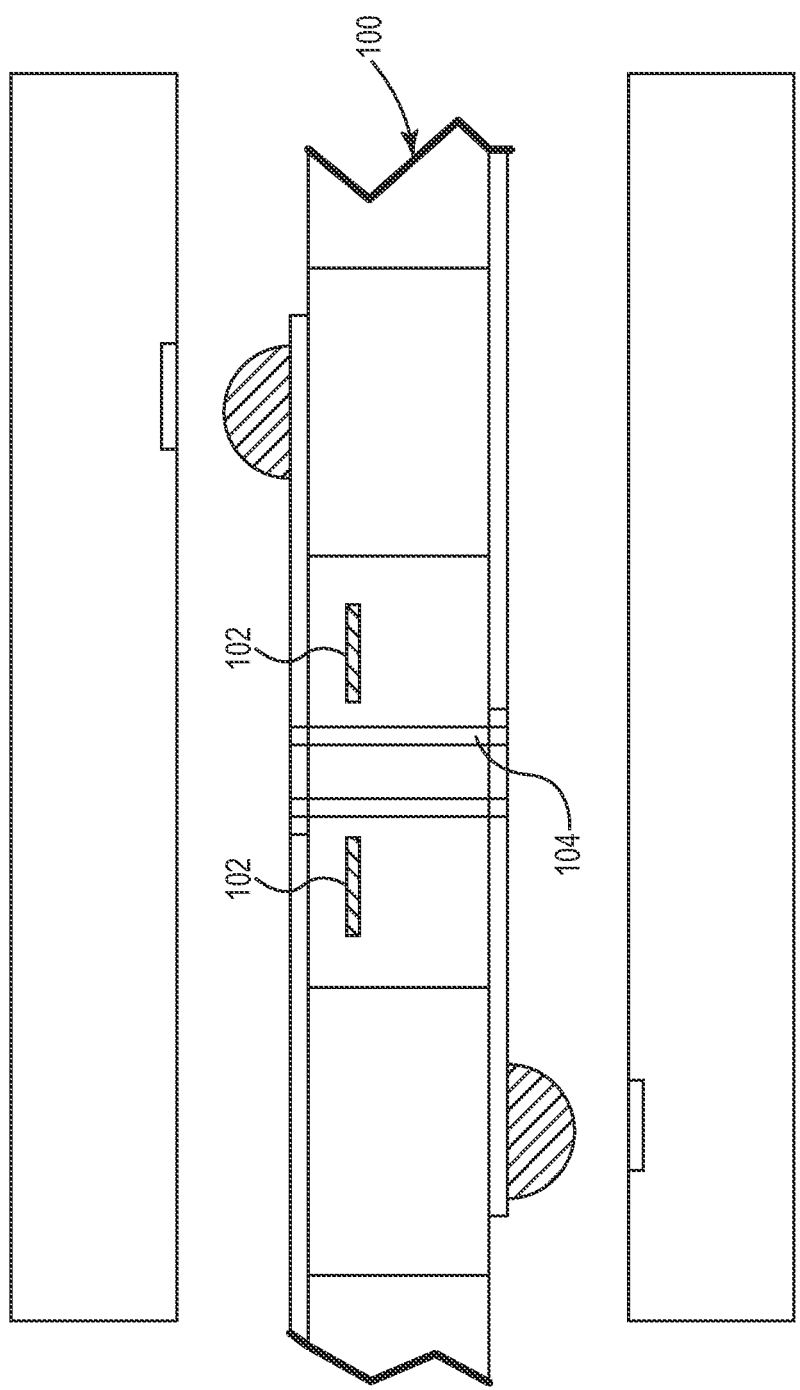
FIG. 2 illustrates an alternate electrical interconnect with conductive traces supported by a compliant material in accordance with an embodiment of the present disclosure.

FIG. 2 illustrates an alternate electrical interconnect 90 that leverages additive processes to add features 92 that enhance electrical performance in accordance with an embodiment of the present disclosure. In the illustrated embodiment, the features 92 are metal planes that reduce the inductive effects of plated via 94. The metal plane 92 can also be used to tune electrical performance. In other embodiments, the features can include decoupling capacitance, redundant contacts, dissimilar contact materials to improve mechanical wear or reduce solder build up during use, and the placement of passive or active components, shielding, transistors, ganged ground pins or planes, and the like.

Figure 3:
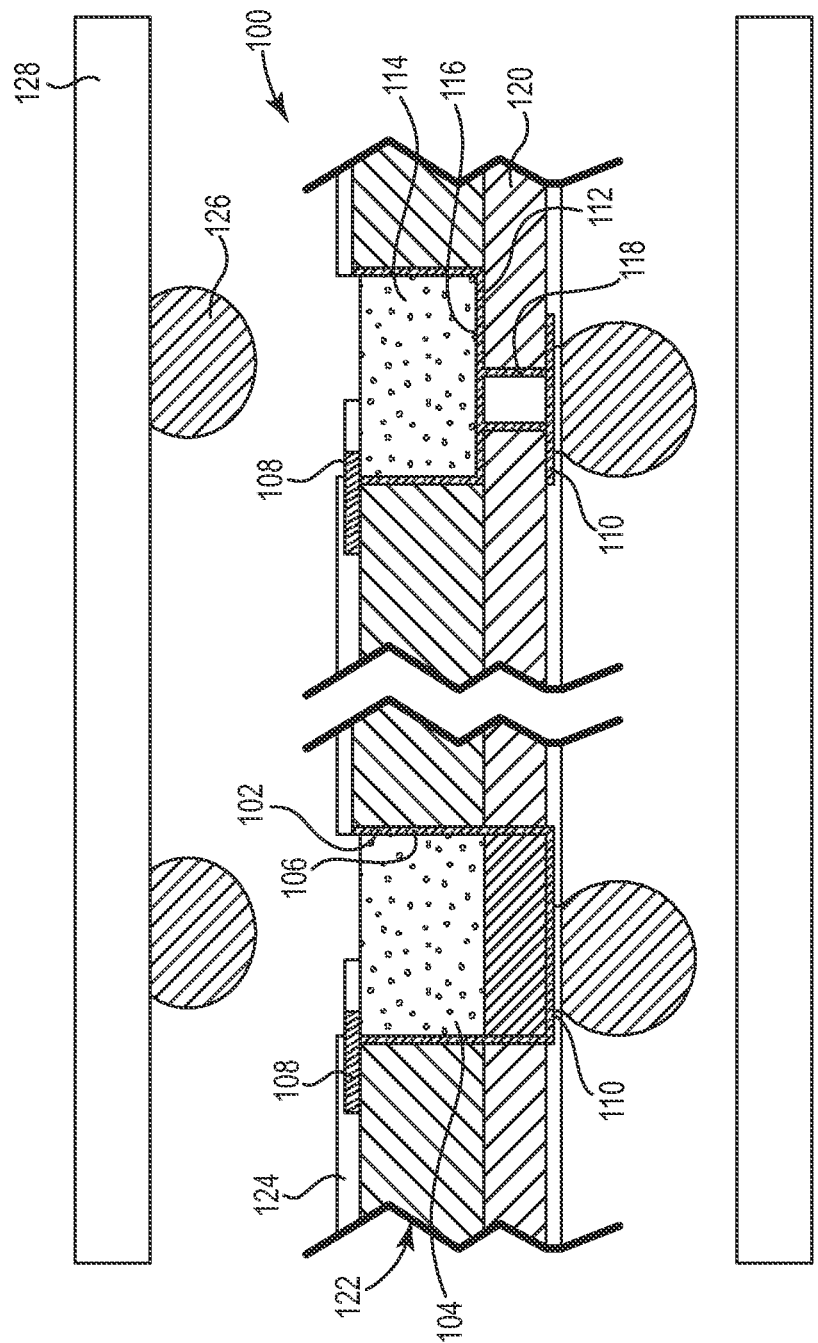
FIG. 3 illustrates another alternate electrical interconnect with conductive traces supported by a compliant material in accordance with an embodiment of the present disclosure.

FIG. 3 is a cross-sectional views of an alternate electrical interconnect 100 in accordance with an embodiment of the present disclosure. Via 72 illustrated in FIG. 1A is eliminated as the connection means and the inner walls 102 of the core cavity 104 are plated 106 to join the upper conductive members 108 and the lower conductive members 110.

In one embodiment, top surface mask 124 is replaced with a film, such as a 1 mil polyimide or LCP film. The film is optionally configured with tabs that extend into the openings 104 to assist with centering solder balls 126 on the IC device 128 relative to the conductive members 108.

In an alternate embodiment, bottom surface 112 of the recess 114 is plated 116. Via 118 is formed in layer 120 of the substrate 122 as the electrical connection between the lower solder pad 110 and the plating 116 and conductive members 108.

Figure 4:
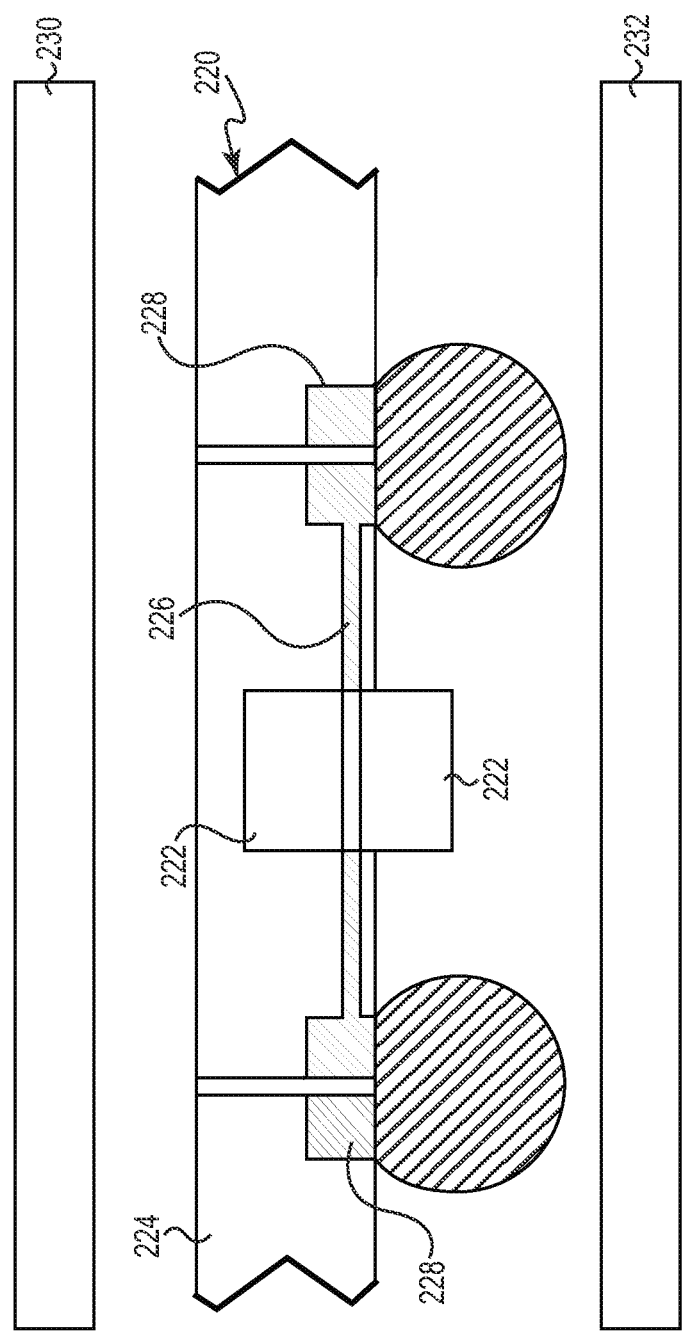
FIG. 4 illustrates an electrical interconnect with on-board electrical devices in accordance with an embodiment of the present disclosure.

FIG. 4 illustrates electrical interconnect 220 with electrical devices 222, such as for example, internal decoupling capacitors, located on substrate 224 in accordance with an embodiment of the present disclosure. Printed conductive traces 226 electrically couple the electrical devices 222 to one or more of the contact pads 228. The electrical devices 222 can be added as discrete components or printed materials, reducing the need for discrete components on the PCB 232 and the integrated circuit device 230. Locating the electrical devices 222 in the semiconductor socket 220 permits integrated circuit manufactures to reduce or eliminate the capacitors currently located on the package 230 and printed circuit board 232. This shift can greatly reduce cost and simplify the package 230 and printed circuit board 232, while improving performance.

The electrical devices 222 can be a power plane, ground plane, capacitor, resistor, filters, signal or power altering and enhancing device, memory device, embedded IC, RF antennae, and the like. The electrical devices 222 can be located on either surface of the substrate 224, or embedded therein. The electrical devices 222 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

Locating such electrical devices 222 on the electrical interconnect 220 improves performance and enables a reduction in the cost of integrated circuit devices and the PCB 232. Integrated circuit manufactures are limited by the pitch that the PCB 232 can accommodate and still keep the printed circuit board to four layers. The integrated circuit makers can manufacture the integrated circuit device 230 with a smaller pitch, but with the pin counts is so high that the printed circuit board 232 likely requires additional layers in order to route all of the signals. The present electrical interconnect 220 also permits integrated circuit manufactures to reduce the pitch of the contacts on the IC device 230, and perform any required signal routing in the electrical interconnect 220, rather than in the printed circuit board 232 or by adding daughter boards to the system.

Figure 5:
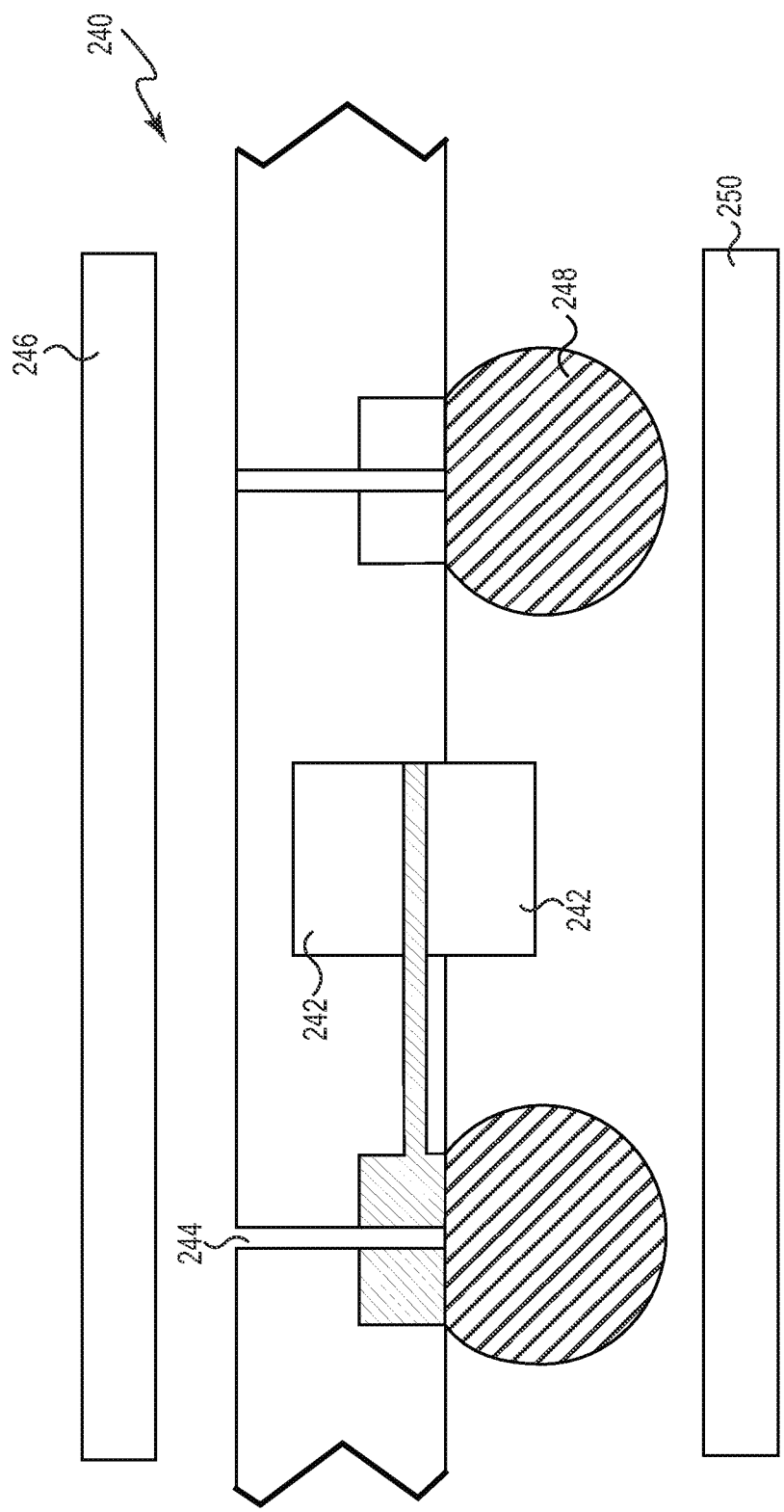
FIG. 5 illustrates an alternate electrical interconnect with on-board electrical devices in accordance with an embodiment of the present disclosure.

FIG. 5 illustrates an alternate electrical interconnect 240 with on-board electrical devices 242 in accordance with an embodiment of the present disclosure. The decoupling capacitance 242 can be a discrete embedded or printed electrical device. Contact member 244 provides the electrical connection to the capacitor located on the semiconductor device 246 and solder ball 248 provides the electrical connection to the capacitor located on printed circuit board 250.

Figure 6:
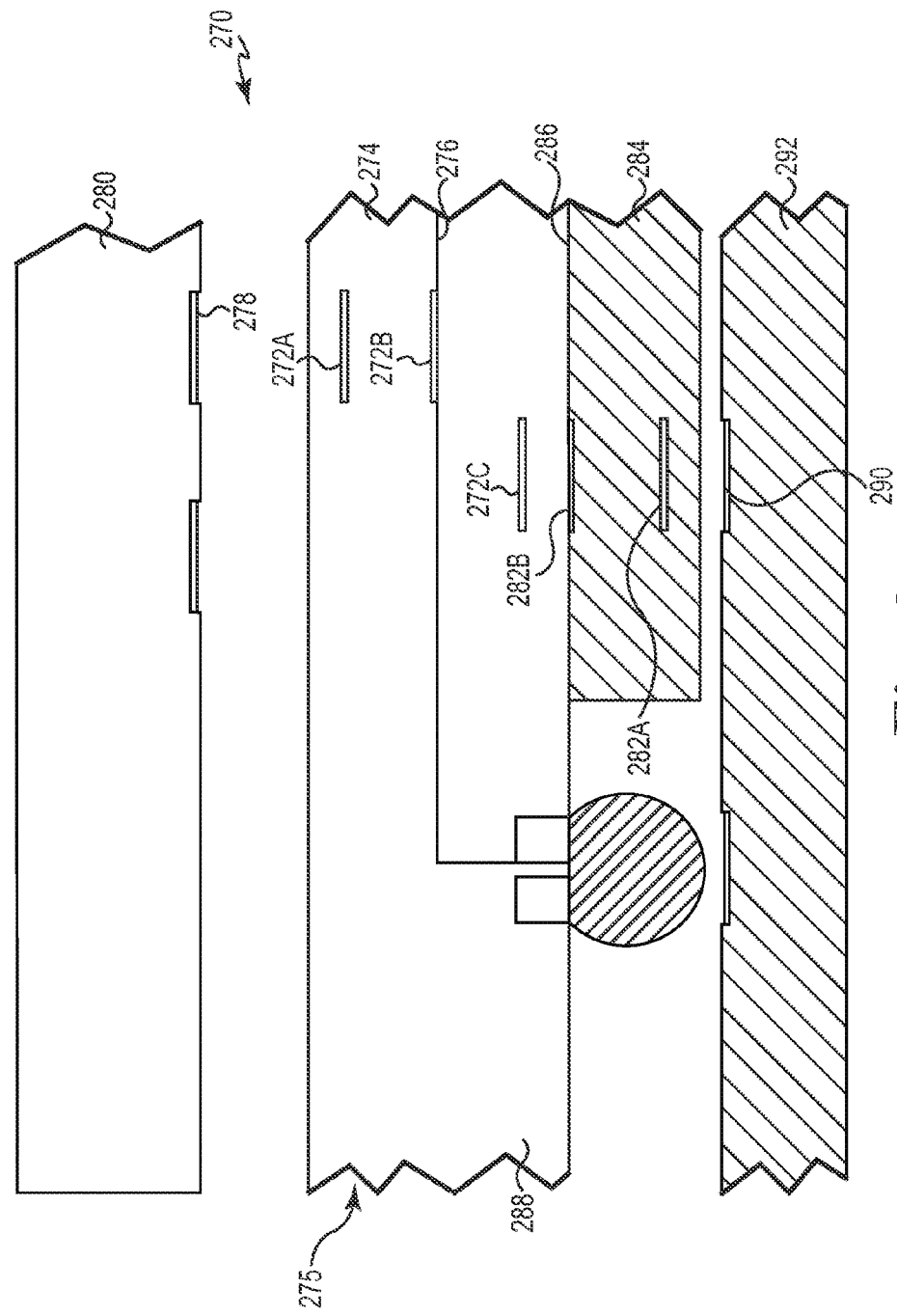
FIG. 6 illustrates an electrical interconnect with capacitive coupling in accordance with an embodiment of the present disclosure.

FIG. 6 is a cross-sectional view of electrical interconnect 270 with various capacitive coupling features in accordance with another embodiment of the present disclosure. A capacitive coupling feature 272A is embedded in layer 274 of the substrate 275. A capacitive coupling feature 272B is located on second surface 276 of the layer 274. The capacitive coupling features 272A, 272B are positioned to electrically couple with contact pad 278 on integrated circuit device 280. The capacitive coupling 272C is embedded in layer 288.

Capacitive coupling feature 282A is embedded in layer 284 of the substrate 275. Capacitive coupling feature 282B is located on first surface 286 of the layer 284. The capacitive coupling feature 282A is positioned to electrically couple with contact pad 290 on the PCB 292. The various capacitive coupling features in the embodiment of FIG. 6 are optionally formed using inkjet printing technology, aerosol printing technology, or other printing technology.

Figure 7:
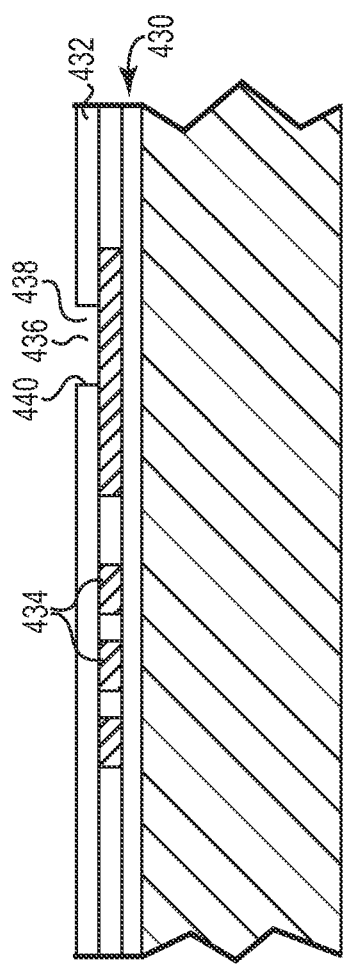
FIG. 7 is a side sectional view of an electrical interconnect in accordance with an embodiment of the present disclosure.

FIG. 7 illustrates an alternate electrical interconnect 430 with an insulating layer 432 applied to the circuit geometry 434. The nature of the printing process allows for selective application of dielectric layer 432 to leave selected portions 436 of the circuit geometry 434 expose if desired. The resulting high performance electrical interconnect 430 can potentially be considered entirely "green" with limited or no chemistry used to produce beyond the direct write materials.

The dielectric layers of the present disclosure may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the dielectric materials are designed to provide electrostatic dissipation or to reduce cross-talk between the traces of the circuit geometry. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 8:
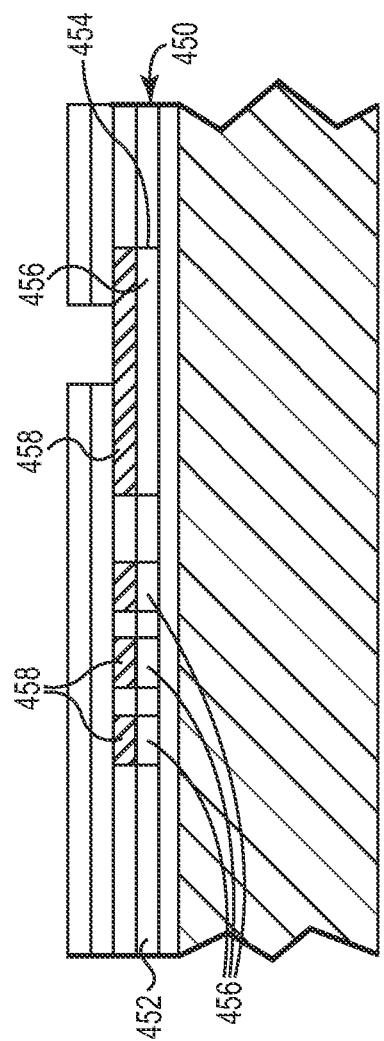
FIG. 8 is a side sectional view of an alternate electrical interconnect with printed compliant material in accordance with an embodiment of the present disclosure.

FIG. 8 illustrates an alternate high performance electrical interconnect 450 in accordance with an embodiment of the present disclosure. Dielectric layer 452 includes openings 454 into which compliant material 456 is printed before formation of circuit geometry 458. The compliant printed material 456 improves reliability during flexure of the electrical interconnect 450.

Figure 9:
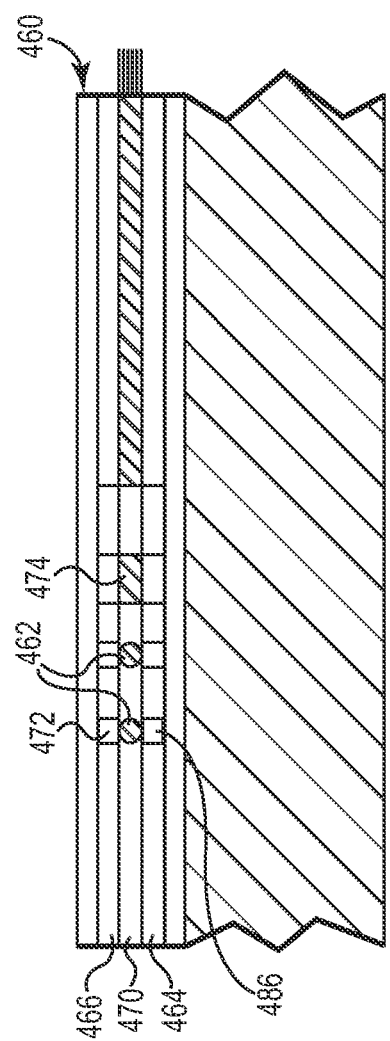
FIG. 9 illustrates an electrical interconnect with optical features in accordance with an embodiment of the present disclosure.

FIG. 9 illustrates an alternate high performance electrical interconnect 460 in accordance with an embodiment of the present disclosure. Optical fibers 462 are located between layers 464, 466 of dielectric material. In one embodiment, optical fibers 462 are positioned over printed compliant layer 468, and dielectric layer 470 is printed over and around the optical fibers 462. A compliant layer 472 is preferably printed above the optical fiber 462 as well. The compliant layers 468, 472 support the optical fibers 462 during flexure. In another embodiment, the dielectric layer 470 is formed or printed with recesses into which the optical fibers 462 are deposited.

In another embodiment, optical quality materials 474 are printed during printing of the high performance electrical interconnect 460. The optical quality material 474 and/or the optical fibers 462 comprise optical circuit geometries. The printing process allows for deposition of coatings in-situ that enhances the optical transmission or reduces loss. The precision of the printing process reduces misalignment issues when the optical materials 474 are optically coupled with another optical structure.

Figure 10:
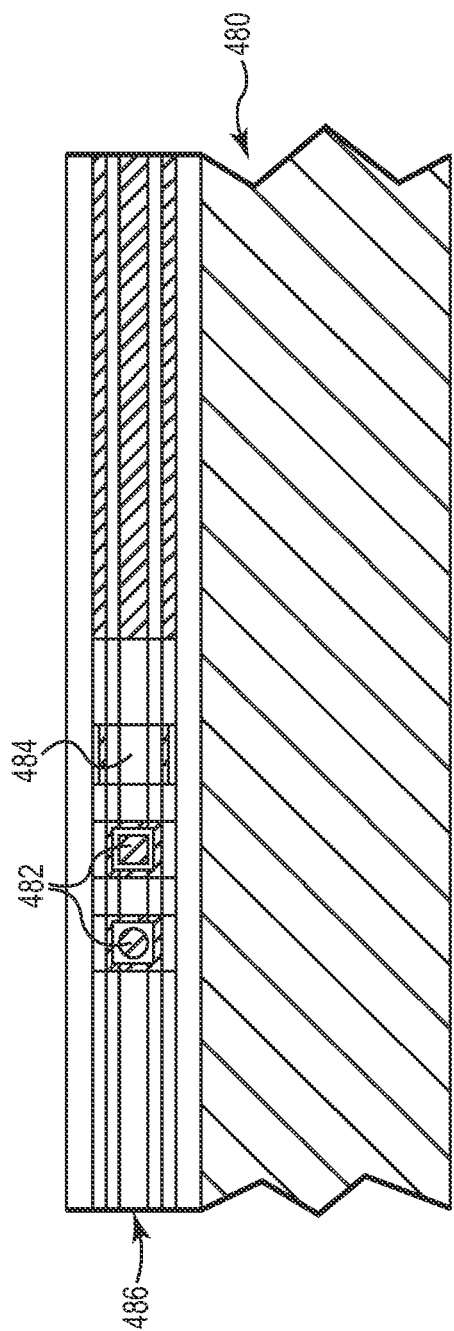
FIG. 10 illustrates an alternate high performance electrical interconnect with optical features in accordance with an embodiment of the present disclosure.

FIG. 10 illustrates another embodiment of a present high performance electrical interconnect 480 in accordance with an embodiment of the present disclosure. Embedded coaxial RF circuits 482 or printed micro strip RF circuits 484 are located with dielectric/metal layers 486. These RF circuits 482, 484 are preferably created by printing dielectrics and metallization geometry.

Figure 11:
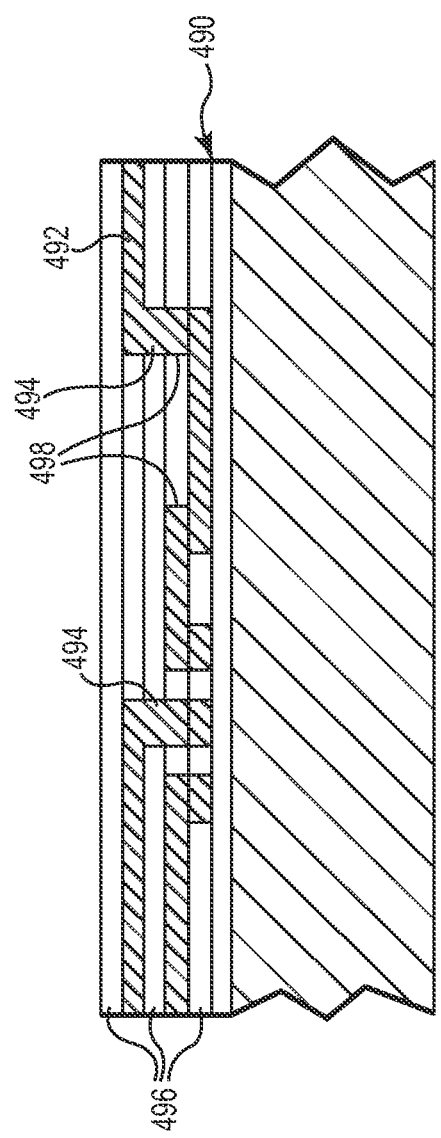
FIG. 11 illustrates an alternate high performance electrical interconnect with printed vias in accordance with an embodiment of the present disclosure.

As illustrated in FIG. 11, use of additive processes allows the creation of a high performance electrical interconnect 490 with inter-circuit, 3D lattice structures 492 having intricate routing schemes. Vias 494 can be printed with each layer, without drilling.

The nature of the printing process permit controlled application of dielectric layers 496 creates recesses 498 that control the location, cross section, material content, and aspect ratio of the conductive traces 492 and the vias 494. Maintaining the conductive traces 492 and vias 494 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 498 to control the aspect ratio of the conductive traces 492 and the vias 494 results in a more rectangular or square cross-section, with the corresponding improvement in signal integrity.

In another embodiment, pre-patterned or pre-etched thin conductive foil circuit traces are transferred to the recesses 498. For example, a pressure sensitive adhesive can be used to retain the copper foil circuit traces in the recesses 498. The trapezoidal cross-sections of the pre-formed conductive foil traces are then post-plated. The plating material fills the open spaces in the recesses 498 not occupied by the foil circuit geometry, resulting in a substantially rectangular or square cross-sectional shape corresponding to the shape of the recesses 498.

In another embodiment, a thin conductive foil is pressed into the recesses 198, and the edges of the recesses 498 acts to cut or shear the conductive foil. The process locates a portion of the conductive foil in the recesses 498, but leaves the negative pattern of the conductive foil not wanted outside and above the recesses 498 for easy removal. Again, the foil in the recesses 498 is preferably post plated to add material to increase the thickness of the conductive traces 492 in the circuit geometry and to fill any voids left between the conductive foil and the recesses 498.

Figure 12:
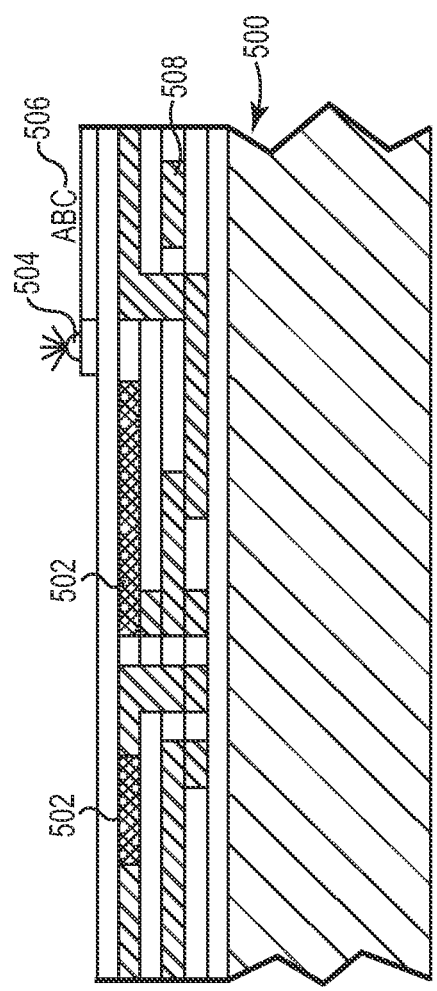
FIG. 12 illustrates an alternate high performance electrical interconnect with printed electrical devices in accordance with an embodiment of the present disclosure.

FIG. 12 illustrates a high performance electrical interconnect 500 with printed electrical devices 502. The electrical devices 502 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 502 include printed LED indicator 504 and display electronics 506. Geometries can also be printed to provide capacitive coupling 508. Compliant material can be added between circuit geometry, such as discussed above, so the present electrical interconnect can be plugged into a receptacle or socket, supplementing or replacing the need for compliance within the connector.

The electrical devices 502 are preferably printed during construction of the interconnect assembly 500. The electrical devices 502 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 502 can be formed using printing technology, adding intelligence to the high performance electrical interconnect 500. Features that are typically located on other circuit members can be incorporated into the interconnect 500 in accordance with an embodiment of the present disclosure.

The availability of printable silicon inks provides the ability to print electrical devices 502, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 502 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate-silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinylidenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layers are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition.

The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either or both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A electrical interconnect between terminals on an IC device and contact pads on a printed circuit board (PCB), the electrical interconnect comprising:
    a substrate comprising a first surface with a plurality of openings arranged to correspond to the terminals on the IC device;
    a compliant material located in the openings;
    a plurality of first conductive traces extending along the first surface of the substrate and onto the compliant material, the compliant material providing a biasing force that resists flexure of the first conductive traces into the openings;
    vias extending through the substrate are electrically coupled the first conductive traces; and
    a plurality of second conductive traces extending along the second surface of the substrate and electrically coupled to a vias, the second conductive traces configured to electrical couple with the contact pads on the PCB.

2. The electrical interconnect of claim 1 comprising first conductive structures electrically coupled to the first conductive traces and positioned over the openings, the first conductive structures configured to enhance electrical coupling with the terminals on the IC device.

3. The electrical interconnect of claim 2 comprising at least one dielectric layer selectively located on the first surface of the substrate to cover the conductive traces, while leaving the first conductive structures exposed.

4. The electrical interconnect of claim 1 wherein the openings extend through the substrate to a second surface.

5. The electrical interconnect of claim 1 wherein the second conductive traces extend onto a compliant material to provide a biasing force that resists flexure of the second conductive traces when compressively engaged with the contact pads on the printed circuit board.

6. The electrical interconnect of claim 1 comprising second conductive structures electrically coupled to the second conductive traces that enhance electrical coupling with the contact pads on the PCB.

7. The electrical interconnect of claim 1 wherein at least one of the first or second conductive traces comprise discrete structures attached to the substrate.

8. The electrical interconnect of claim 1 wherein the first conductive traces are soldered to the terminals on the IC device.

9. The electrical interconnect of claim 1 where in the substrate comprises at least one additional circuitry plane, the additional circuitry plane selected from one of a ground plane, a power plane, an electrical connection to other circuit members, a dielectric layer, or a flexible circuit.

10. The electrical interconnect of claim 1 comprising at least one printed electrical device located on the substrate and electrically coupled to at least a one of the first or second conductive traces, wherein the electrical device is selected from one of shielding, near device decoupling, capacitors, transistors, resistors, filters, signal or power altering and enhancing devices, memory devices, embedded IC devices, RF antennae, and the like.

11. An electrical interconnect assembly comprising:
a housing that retains the electrical interconnect of claim 1;
the IC device located in the housing so the terminals on the IC device are electrically coupled to the first conductive traces; and
terminals on the printed circuit board soldered to the second conductive traces located at the second surface of the substrate.

12. A method of making an electrical interconnect between terminals on an IC device and contact pads on a printed circuit board (PCB), the method comprising the steps of:
forming a plurality of openings in a first surface of a substrate at locations corresponding to the terminals on the IC device;
locating a compliant material in the openings;
locating a plurality of first conductive traces on the first surface that extend onto the compliant material, the compliant material providing a biasing force that resists flexure of the first conductive traces into the openings;
forming vias extending through the substrate electrically coupled the first conductive traces; and
forming a plurality of second conductive traces extending along the second surface of the substrate electrically coupled to a vias, the second conductive traces configured to electrical couple with the contact pads on the PCB.

13. The method of claim 12 comprising forming first conductive structures electrically coupled to the first conductive traces and positioned over the openings, the first conductive structures configured to enhance electrical coupling with the terminals on the IC device.

14. The method of claim 13 comprising depositing at least one dielectric layer selectively on the first surface of the substrate to cover the first conductive traces, while leaving the first conductive structures exposed.

15. The method of claim 12 comprising forming the second conductive traces on a compliant material to provide a biasing force that resists flexure of the second conductive traces when compressively engaged with the contact pads on the printed circuit board.

16. The method of claim 12 comprising forming second conductive structures electrically coupled to the second conductive traces that enhance electrical coupling with the contact pads on the PCB.

17. The method of claim 12 comprising the steps of:
forming at least one of the first or second conductive traces as discrete structures; and
attaching the discrete structures to the substrate.

18. A method of making an electrical interconnect assembly comprising the steps of:
locating the electrical interconnect of claim 12 in a housing;
positioning the IC device in the housing to electrically couple the terminals on the IC device to the first conductive traces; and
soldering the contact pads on the PCB to the second conductive traces on the second surface of the substrate.

19. A method of making an electrical interconnect assembly comprising the steps of:
locating the electrical interconnect of claim 12 in a housing;
positioning the IC device in the housing to electrically couple the terminals on the IC device to the first conductive traces; and
biasing the IC device against the first surface of the substrate to flex the first conductive traces into the openings against the resistance of the compliant material.

20. A method of making an electrical interconnect assembly comprising the steps of:
locating the electrical interconnect of claim 12 in a housing;
electrically coupling the contact pads on the PCB with the second conductive traces on the second surface of the substrate; and
biasing the PCB against the second surface of the substrate to flex the second conductive traces into the openings against the resistance of the compliant material.

* * * * *